Figure 1:
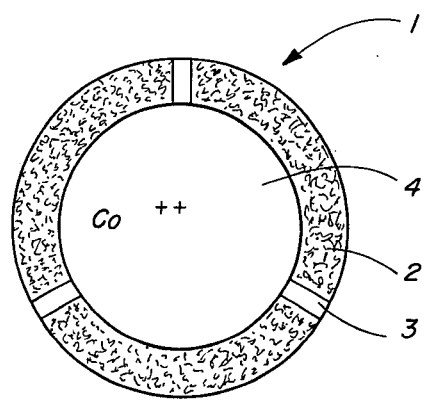

United States Patent [19]

O'Brien

[11] 4,084,967
[45] Apr. 18, 1978

[54] PHOTOGRAPHIC ELEMENTS CONTAINING VESICLES OF RHODOPSIN AND LIPIDS

[75] Inventor: David Frank O'Brien, Rochester, N.Y.

[73] Assignee: Eastman Kodak Company, Rochester, N.Y.

[21] Appl. No.: 767,015

[22] Filed: Feb. 9, 1977

[51] Int. Cl.$^2$ .................. G03C 5/24; G03C 5/54; G03C 1/52; G03C 1/00

[52] U.S. Cl. ................... 96/29 R; 96/29 D; 96/48 R; 96/48 QP; 96/48 PD; 96/76 R; 96/77; 96/88; 96/90 R; 96/49; 96/89; 96/92

[58] Field of Search .......... 96/88, 90 R, 48 R, 48 QP, 96/29 R, 29 D, 76 R, 27 R, 77, 49, 92, 48 PD, 89

[56] References Cited

PUBLICATIONS

K. Hong and W. L. Hubbell, Biochemistry 12, 4517, (1973).

M. Montal, "Rhodopsin in Bilayer Membranes," Biochemical Society Transactions, vol. 4, No. 4, Jul. 1976.

*Primary Examiner*—Won H. Louie, Jr.
*Attorney, Agent, or Firm*—Arthur H. Rosenstein

[57] ABSTRACT

A photographic element comprises a support having thereon a binder containing numerous vesicles, each vesicle comprising a matrix of lipid membranes containing rhodopsin and one of
 (a) metal cations or
 (b) materials selected from the group consisting of chelatometric materials, colorimetric reagents for said metal cations, materials which are caused to react by the presence of said metal cations to form a gas or a visible reaction product, and materials which form elemental metal through redox reactions with said metal cations inside the vesicles and the other (a) or (b) outside the vesicles. On imagewise exposure to light, the metal cations flow through the vesicles and react with the above material in the exposed areas only.

44 Claims, 1 Drawing Figure

PHOTOGRAPHIC ELEMENTS CONTAINING VESICLES OF RHODOPSIN AND LIPIDS

This invention relates to new photographic elements and new processes for forming photographic images.

There has been recent research in the biophysical and biochemical fields concerning the molecular aspects of vision in various animals. The relationship of the light-sensitive protein rhodopsin, retinal and vitamin A has been the subject of several studies which are summarized by Wald (G. Wald, Nature 217, 800 (1968)). Rhodopsin is the primary protein component of photoreceptor cell membranes, and exists in these natural light-sensitive membranes in association with lipids, primarily phospholipids. Membranes are composed of a lipid bilayer with some proteins associated with the polar of hydrophilic surface of the bilayer and other proteins penetrating into or through the lipid bilayer (S. J. Singer and G. L. Nicolson, Science 175, 720 (1972)).

In order to more fully study the biophysical aspects of this visual phenomenon, vesicle preparations of rhodopsin incorporated into phospholipid bilayers deemed recombined or recombinant membranes as models to duplicate the natural membranes have been made. It has been demonstrated in these preparations that the rhodopsin is light-sensitive and after light bleaching, the rhodopsin can be chemically regenerated by treatment with 11-cis-retinal in the same manner that photoreceptor membranes may be regenerated (K. Hong and W. L. Hubbell, Biochemistry 12, 4517 (1973)). In a presentation to the Biochemical Society, Montal discussed the preparation of rhodopsin-lipid vesicles, the exposure to light and a subsequent increase in permeability to $Na^+$, $Cs^+$, $Ca^{2+}$, glucose and glycerol to study the function of photoreceptor cell membranes (M. Montal, "Rhodopsin in Bilayer Membranes," Biochemical Society Transactions, Volume 4, No. 4, July, 1976).

The role of rhodopsin in the transduction of light to electrical energy in photoreceptor cell membranes is unclear and work is continuing in the biophysical and biochemical fields.

It has now been found that a photographic material element containing vesicles comprising a matrix of lipid membranes containing rhodopsin and certain other materials and a process for treating the vesicles can produce a useful photographic image.

In one embodiment of this invention, a photographic element comprises a support having thereon a layer comprising a hydrophilic binder containing numerous vesicles that comprise a matrix of lipid membranes containing rhodopsin and containing in the vesicles a member of the group consisting of:

(a) metal cations; and
(b) materials which are selected from the group consisting of chelatometric materials, colorimetric reagents for said metal cations, materials which are caused to react by the presence of said metal cations to form a gas or a visible reaction product, and materials which form elemental metal through redox reactions with said metal cations inside the vesicles and the other (a) or (b) outside the vesicles. The element also contains, in an area outside the vesicles, either in the same layer or in a contiguous layer, a member of the group consisting of:

(a) metal cations; and
(b) materials which are selected from the group consisting of chelatometric materials, colorimetric reagents for said metal cations, materials which are caused to react by the presence of said metal cations to form a gas or a visible reaction product, and materials which form elemental metal through redox reactions with said metal cations wherein if the vesicles contain (a) then the surrounding area will contain (b) and if the vesicles contain (b) then the surrounding areas will contain (a).

Another embodiment of this invention comprises a method of forming photographic images comprising imagewise exposing to light having a wavelength of about 350 nm to 600 nm a photographic element comprising a support having thereon a layer comprising a hydrophilic binder containing numerous vesicles that comprise a matrix of lipid membranes containing rhodopsin and containing in the vesicles a member of the group consisting of:

(a) metal cations; and
(b) materials which are selected from the group consisting of chelatometric materials, colorimetric reagents for said metal cations, materials which are caused to react by the presence of said metal cations to form a gas or a visible reaction product, and materials which form elemental metal through redox reactions with said metal cations inside the vesicles and the other (a) or (b) outside the vesicles. In the described method the element contains, outside the vesicles, either in the same layer or in a contiguous layer, a member of the group consisting of:

(a) metal cations; and
(b) materials which are selected from the group consisting of chelatometric materials, colorimetric reagents for said metal cations, materials which are caused to react by the presence of said metal cations to form a gas or a visible reaction product, and materials which form elemental metal through redox reactions with said metal cations is present wherein if the vesicles contain (a) then the surrounding area will contain (b) and if the vesicles contain (b) then the surrounding areas will contain (a)

wherein the metal cations permeate the vesicles and react with the materials (b) in the exposed areas. The image can thus be formed by the metal complex, elemental metal, or colored material in the vesicles or outside the vesicles.

It is noted that photographic elements containing these vesicles are highly advantageous in that each vesicle can contain many metal cations and, in most instances, it requires only a few photons to render the vesicle permeable so that many metal cations can react with the materials to form an image. Therefore, the process has relatively high speed.

A variety of hydrophilic binders can be useful in formulating the layer containing the vesicles. The binder need not be polymeric. Preferred hydrophilic binders include gelatin, poly(vinyl alcohol), poly(N-vinyl-2-pyrrolidone), polyacrylamide and copolymers derived from acrylamide, and acrylic homo- and copolymers derived from hydrophilic monomers such as acrylic acid, methacrylic acid, vinylbenzyl alcohol, hydroxyalkyl acrylates, N-hydroxyalkylacrylamides, sulfoalkyl acrylates, and the like.

The coating containing the hydrophilic binder can be coated on a variety of supports. The support may be transparent or opaque. Materials useful as supports for photographic elements are useful. Examples of useful supports are cellulosic products such as paper, polymers such as polyesters which supports are used for heterogeneous catalysis, such as poly(ethylene terephthalate), cellulose acetate, cellulose acetate butyrate, cellulose nitrate, polycarbonates, polystyrene and the like, metals such as aluminum, copper, zinc and tin and the like and siliceous materials such as glass and the like.

Molecules useful in forming the lipid membrane vesicles are amphiphatic. That is, the molecules contain both a hydrophilic and hydrophobic moiety and form bilayer structures that interface with aqueous solutions. An adequate description of lipid membranes and lipids which are useful herein can be found in "Lipid Analysis" by William W. Christie, Perganon Press, Oxford, England, 1973. Further description can be found in the various biochemical articles such as G. B. Ansell, J. N. Hawthorne, and R. M. C. Dawson "Form and Function of Phospholipids," Elsevier Scientific Publishing Company, Amsterdam, The Netherlands (1973); A. D. Bangham, M. W. Hill and N. G. A. Miller, "Methods in Membrane Biology," Volume 1, ed. E. D. Korn, Plenum Press, New York (1974), page 1; S. Razin, Biochim. Biophys. Acta 265, 241 (1972); C. Tanford "The Hydrophobic Effect," Wiley-Interscience, New York (1973).

Especially useful lipid membranes comprise phospholipids such as phosphatidylcholine, phosphatidylethanolamine and phosphatidylserine and the like, sphingolipids such as sphingomyelin and the like, glycolipids such as cerebrosides, phytoglycolipids, gangliosides and the like, phosphonolipids such as ceramide-2-aminoethylphosphonic acid, phosphonoglycerides and the like and sterols such as cholesterol, lanosterol, ergosterol, β-sitosterol and the like.

In a preferred embodiment the lipid membranes comprise a phospholipid represented by the formula:

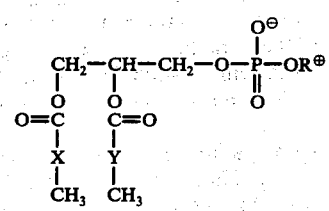

wherein X and Y are independently selected from the group consisting of saturated or unsaturated aliphatic groups containing 10 carbon atoms or greater and preferably from 14 to 22 carbon atoms such as alkylene such as decylene, dodecylene, tetradecylene, hexadecylene, octadecylene and the like and R$^\oplus$ is selected from the group consisting of a 2-trimethylammonioethyl (—CH$_2$CH$_2$N$^\oplus$(CH$_3$)$_3$), ammonioethyl (—CH$_2$CH$_2$N$^\oplus$H$_3$) and 2-carboxy-2-ammonioethyl

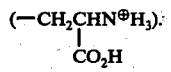

Further examples of phospholipids can be found in "Methods in Membrane Biology" by Korn, Volume 1, Plenum Press, New York, 1974, pages 55 to 60.

It is believed that the rhodopsin which is incorporated in the vesicles functions as a light-sensitive gate which prevents diffusion of the metal cations into or out of the membrane vesicle in the absence of light but allows such diffusion upon absorption of light. The rhodopsin is a protein pigment generally found in the retina of the eye and can be obtained from animals such as cattle, sheep, horses, frogs, birds, fish and the like. The preferred rhodopsin is vertabrate rhodopsin. The rhodopsin is generally obtained by detergent extraction of photoreceptor cell membranes.

Various methods of obtaining rhodopsin can be found in the following articles: G. Wald, Nature 219, 800 (1968); F. J. M. Daeman, Biochim. Biophys. Acta 300, 255 (1973); K. Hong and W. L. Hubbell, Biochemistry 12, 4517 (1973); and M. L. Applebury, D. M. Zuckerman, A. A. Lamola, and T. M. Jovin, Biochemistry 13, 3448 (1974).

The molar ratio of rhodopsin to lipid in the vesicles can vary widely but is generally from about 1:25 to about 1:25,000. The preferred molar ratio of rhodopsin to lipids is 1:100 to 1:1000. The concentration of hydrophilic binder can vary depending upon, for example, the particular lipid, desired image and the like. Preferably, however, the coating composition to form the layer comprises from about 2 to about 15 percent by weight of hydrophilic binder.

The vesicles containing rhodopsin and lipids can be formed by adding purified rhodopsin in an aqueous buffer such as phosphate, N-2-hydroxyethylpiperazine-N'-2-ethanesulfonic acid and the like to the lipid. The resulting detergent solution is equilibrated and the detergent is removed by dialysis. The removal of detergent causes the lipids to self assemble into a bilayer membrane with the incorporated rhodopsin. More extensive discussions of the vesicle formation can be found in K. Hong and W. L. Hubbell, Proc. Nat. Acad. Sci., U.S., 69, 2617 (1972) and K. Hong and W. L. Hubbell, Biochemistry 12, 4517 (1973).

The vesicle size with the incorporated metal cations or materials which react with the metal ions can vary but will generally be about 250 A to 10 microns. A preferred range is 300 A to 5000 A. The described binder will preferably contain numerous vesicles that include a coverage of about 10$^{15}$ to about 10$^{19}$ vesicles/m$^2$.

In a preferred embodiment the metal cations are encapsulated in the vesicle. Any metal cations can be useful for this purpose. Preferred metal cations are transition metals, rare earths and the alkaline earth metals. Examples of useful metal cations are Co$^{++}$, Mn$^{++}$, Eu$^{+++}$, Cu$^{++}$, Ca$^{++}$ and the like. Particularly preferred metal cations are those selected from groups 1B, VII and VIII of the Periodic Chart of elements.

If the metal cations are to be incorporated in the vesicles so that the image is formed outside the vesicles, they can be incorporated by sonicating a suspension of the rhodopsin:lipid recombinants in an ice bath in the presence of a salt of the metal cation such as CoCl$_2$, MnCl$_2$, CoBr$_2$, Co(NO$_3$)$_2$, MnSO$_4$, CaCl$_2$, EuCl$_3$ and the like. It is preferred to pass the resulting suspension through a gel permeation column with a buffer or to dialyze the suspension in order to separate the vesicles and entrapped metal cations from the external metal ions.

The amount of metal cation in the area in which the metal image is not formed should generally be at least about 100 times as concentrated as the area in which the image is to be formed. That is, if the metal cations are to be in the vesicles and transferred out of the vesicles after light exposure, then the concentration of metal cations inside the vesicles prior to exposure should be at least about $10^2$ times that of the concentration in the areas outside the vesicles.

In most cases, metal cations will be present only either in the vesicles or outside the vesicles. However, it is possible that metal cations could be present in both areas. If so, then a concentration variance of at least about $10^2$ should be maintained. If, for instance, the metal cations are to be incorporated in the vesicles, the concentration of the cations is generally from about $10^{-4}$ molar to about $10^{-1}$ molar in the vesicles. If the image is to be formed in the vesicles, the concentration of metal cations outside the vesicles prior to exposure should be about $10^{-5}$ to about $10^{-2}$ molar.

The FIGURE in the drawing illustrates a preferred embodiment of this invention whereby the vesicle itself 1 comprises a lipid membrane 2 containing rhodopsin 3. The metal cations 4 $Co^{++}$ are inside the vesicles encompassed by the membranes. When the vesicles are struck by light, the rhodopsin 3 allows the metal cations 4 out of the vesicles in only the exposed areas to react with the material (b).

Metal ions are known to react easily with a variety of materials to produce color changes. For example, inorganic qualitative analysis text books such as T. B. Hogness and W. C. Johnson "Qualitative Analysis and Chemical Equilibrium" 4th Ed., Henry Holt and Company, New York, New York (1954), contain analytical methods for the determination of the most commonly encountered cations. The analytical tests described generally involve the formation of soluble or insoluble colored complexes or salts of the metal to be determined. Such straightforward chemistry, although perhaps not the basis for preferred image-forming processing, nevertheless illustrates the feasibility of using an imagewise distribution of a wide variety of cations to produce detectable images. In quantitative analyses, for example, the cations of the silver group metals, $Ag^+$, $Pb^{++}$, and $Hg^{++}$ are precipitated by $Cl^-$ ions, and other materials selectively cause precipitation or color formation, e.g. $Cr_2O_9^{--}$ ($Pb^{++}$), or the combination of $Cl^-$ and $NH_4OH$ ($Hg^{++}$); the copper arsenic group metals $Hg^{++}$, $Pb^{++}$, $Bi^{+++}$, $Cu^{++}$, $Cd^{++}$, $Sb^{++}$, $Sn^{++}$, and $Sn^{++++}$ are all precipitated by sulfide ion, or are selectively determined by reaction with such reagents as sulfate ion (Pb), base ($Cu^{++}$), sodium thiosulfate ($Sb^{+++}$), and sodium stannite ($Bi^{+++}$); the aluminum-zinc group, $Al^{+++}$, $Cr^{+++}$, $Fe^{+++}$, $Co^{++}$, $Ni^{++}$, $Fe^{++}$, $Mn^{++}$, and $Zn^{++}$ are all precipitated by sulfide ion or base and are selectively determined by reaction with such materials as potassium nitrite ($Co^{++}$), dimethylglyoxime ($Ni^{++}$), potassium thiocyanate ($Fe^{+++}$, $Mn^{++++}$), sodium bismuthate ($Mn^{++}$), and lead acetate ($CrO_4^{--}$). Numerous volumes on quantitative analysis and colorimetric methods of analysis provide more sophisticated methods and materials for detecting cations under a variety of difficult conditions, for example, the presence of specific metals in complex mixtures such as blood, steel, oil, food and the like. See, for example, K. Kodama, "Methods of Quantitative Inorganic Analysis," Interscience Publishers, New York, New York (1963), E. Sandell, Colorimetric Determination of Traces of Metals, 3rd Ed., Interscience Publishers, New York, New York (1959), and the series of volumes by Snell and Snell, "Colorimetric Methods of Analysis," D. Van Nostrand Company, Inc., New York, New York. Such references specify preferred precipitating and chelating agents, e.g. ethylenediaminetetraacetic acid (EDTA), nitrilotriacetic acid (NTA), 1,2-diaminocyclohexanetetraacetic acid (CyDTA) and ethylene glycol bis(2-aminoethyl)tetraacetic acid (EGTA).

The material (b) which reacts with the metal cation can be present either outside the vesicles or inside the vesicles.

The material (b) which reacts with the metal cations is selected from the group consisting of chelatometric materials, colorimetric reagents for said metal cations, materials which are caused to react by the presence of said metal cations to form a gas or a visible reaction product, and materials which form elemental metal through redox reactions with said metal cations.

Chelatometric materials are well known reactants with metal cations to form metal chelates. Although one skilled in the art is well acquainted with the materials which form chelates with metals, a listing of such materials is found in EASTMAN Dataservice Catalog "Eastman Dyes, Stains, and Indicators," JJ-196 (1974) pages 7–10 which is herein incorporated by reference. Examples of such materials are ammonium thiocyanate, methylene blue and xylenol orange tetrasodium salt for cobalt; 3,3'-dimethylnaphthidine, murexide, and pyrocatechol violet for copper; bromopyrogallol red, 4-(2-pyridylazo) resorcinol, and 8-quinolinol for manganese; and carminic acid and dithizone for the rare earth metals.

Colorimetric reagents for the metal cations include those that react with the cation to form a complex. Complexing agents (colorimetric reagents) useful herein are extensively described in EASTMAN Dataservice Catalog, "Eastman Dyes, Stains, and Indicators" JJ-196 (1974) pages 10–22 which is herein incorporated by reference. Examples of such materials are chloranilic acid, 2-methyl-8-quinolinol and oxalic acid for calcium; 5-amino-1,3,4-thiadiazole-2-thiol, dimethylglyoxime and thioacetamide for cobalt; anthranilic acid, 2,2'-bipyridine and 2,4-pentanedione for copper; anthranilic acid, cupferron and dimethyl oxalate for lanthanide; and calcichrome, hydroquinone and o-tolidine for manganese.

Materials which are caused to react by the presence of the metal cations to form a gas or a visible reaction product are useful for amplification processes resulting in imaging processes of high speed. In this process, only a low coverage of the imagewise distribution of the metal ion is required since the final visible image is obtained by an independent chemical reaction such as a catalyzed redox reaction. The materials which are caused to react by the metal can be termed "catalase-active or peroxidase-active catalysts" such as described in U.S. Pat. No. 3,765,896 (column 1) which is herein incorporated by reference. These materials have been used, for example, in catalyzing the $H_2O_2$ oxidation of reducing agents to give visible reaction products of organic dye images such as described in P. M. Enriques, Research Disclosure, 14849, August, 1976, page 41 and U.S. Pat. Nos. 3,761,265, 3,765,890 and 3,817,750 or the catalytic decomposition of $H_2O_2$ to form a gas which gives a vesicular image such as described in U.S. Pat. Nos. 3,761,265, 3,765,890 and 3,817,750. These materials are particularly useful for $Co^{++}$, $Mn^{++}$ and $Cu^{++}$ ions. Visible reaction products are also formed by the presence of the cation, for example, as described on page 16 herein.

Materials which form elemental metal through redox reactions with the metal cations are particularly useful with transition metal ions. using these materials, the metal ions generated by the photodiffusion process of this invention are converted to an imagewise distribution of the corresponding elemental metal which is then utilized as heterogeneous catalyst centers for the initiation of some redox type amplification process. The reduction of the transition metal ions to their elementary state can be an in situ process in which the reducing agent of the redox amplification element effects this reduction or an independent chemical reduction step can be incorporated to first generate the zero valent metal heterogeneous catalyst which is then used to initiate the catalytic redox amplification reaction. Especially useful transition metal ions which function as heterogeneous catalyst precursors are those comprising groups 1B and VIII of the periodic table. These metals are well known to be efficient catalysts in a wide variety of redox processes.

A wide variety of redox amplification processes well known in the photographic art can be used to amplify the imagewise distribution of the catalytic metallic nuclei to give visible images. These include silver physical developers as described in H. Jonker, A. Molenaar and C. J. Dipple, Photog. Sci. Eng., 13, 43 (1969), L. K. H. Beek, Philips Technical Review, 33, 1 (1973), and F. Pearlstein and R. F. Wrightman, Plating, Feb. 1974, page 154, various non-silver physical developers as described in G. Gutzeit et al, Electroplat. Eng. Handb., 3rd Ed., A. K. Graham, ed., 1971, page 486 (i.e. copper as described in U.S. Pat. 3,674,489, French Patent 2,251,034, nickel as described in L. F. Spencer, Metal Finishing, October, 1974, page 35, U.S. Pat. No. 3,650,748, U.S. Pat. No. 3,598,587, and cobalt as described in F. Pearlstein and R. F. Wrightman, J. Electrochem. Soc., 121, 1023 (1974) physical developers), dye physical developers in which a formazan dye such as described in U.S. Patent Application 567,667 filed April 14, 1975 or phthalocyanine such as described in U.S. Patent Application 567,668 filed April 14, 1975 is deposited by the catalytic reduction of the leuco forms of the dyes. The Pd(O) and Ag (O) catalyzed decomposition of $H_2O_2$ has also been reported in Agfa U.S. Pat. Nos. 3,765,890, 3,761,265 and 3,674,490, this reaction being used to form organic dyes or vesicular images.

The above physical developers are used as aqueous solutions but the imagewise distribution of catalytic nuclei obtained by the process of this invention can also be incorporated in a dry imaging element. Dry silver amplification chemistry is well known in the photographic art as described in U.S. Pat. No. 3,761,279, 3,700,457, 3,785,830, British Patents Nos. 1,342,523 and 1,342,522 and dry processes based on the catalyzed thermal deposition of tellurium have recently been reported in U.S. Patent Applications No. 703,405 filed July 8, 1976 and 703,477 filed July 8, 1976.

Particularly useful complexes (materials which are caused to react by the presence of metal cations to form a gas or a visible reaction product) comprise a mixture of $Co^{+++}$ $(NH_3)_6$ and pyridylazoresorcinol (PAR), pyridylazonaphthol (PAN) or similar dye precursors. If the metal cation used is $Co^{++}$, when the element is light exposed, the $Co^{++}$ ions result in the reaction:

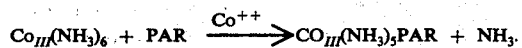

The $Co_{III}(NH_3)_5PAR$ or PAN in the imaged areas is dark blue. The particular reactions which form images in this manner are described in Research Disclosure 12617 (October, 1974) as well as U.S. Pat. No. 3,856,524.

In another particularly preferred embodiment, material (b) is a dye or dye precursor which changes color on complexing with metal ions in the imaged areas.

The amount of material which complexes with the metal used is not critical, however, generally the greater the amount of metal ions used, the greater is the amount of material (b) used. It is generally preferred to use approximately stoichiometric or greater amounts of material (b).

The complexing material can be either in the vesicles or in the area outside the vesicles. If material (b) is located outside the vesicles, it can be present either in the layer containing the vesicles or in a contiguous layer such that after light exposure, the metal cations permeate through the vesicles and react with material b) to form an image.

If material b) is to be present in the vesicles, they can be incorporated therein by sonicating a suspension of the rhodopsin:lipid recombinants in an ice bath in the presence of the appropriate compounds.

The layer containing the hydrophilic binder, the vesicles and optionally the metal cations or material (b) can be coated onto the support or onto a separate layer on the support by merely adding the components in water and coating by any known technique such as dip coating, roll coating, curtain coating, spin coating, hand doctor blade coating and the like.

As the layer may be more light-sensitive if it retains some water, it is preferred to only partially dry the coating prior to exposure. The layer prior to exposure preferably contains at least 5 percent by weight of water. It is particularly preferable to use from about 25 to about 30 percent by weight water in the layer. After the exposure, the coating can be further dried to partially desensitize the coating to light.

The preferred methods of forming images comprise imagewise exposing the photographic element to light having a wavelength of 350 nm to 600 nm, generally having a peak of about 500 nm. The vesicles then become permeable to metal cations which, if contained inside the vesicles, migrate out to react with material (b) outside the vesicles in the exposed areas, or if material (b) is inside the vesicles, the metal cations migrate into the vesicles to react with material (b) in the vesicles.

It is noted that coatings having a Tg below room temperature are generally more light-sensitive. Therefore, an element which is stable in light can be prepared by drying the coating to a point where the light sensitivity is extremely low and just prior to, or on exposure, adding water to render the coating more light-sensitive. A further drying after exposure will again render the coating less sensitive to light.

Another preferred method is to form the coating containing the vesicles with metal cations on the support and temporarily laminate this to a support containing a coating comprising material (b). The sheets are imagewise exposed to light whereby the metal cation migrates to material (b) and forms an image. The elements are then peeled apart, leaving the transferred image. It may be desirable to have a mordant present in the receiving layer to stabilize the transferred image.

The exposed light-sensitive element can be rendered light-sensitive and reuseable after use by removing the transferred image and regenerating the light-sensitive layer by using the techniques such as those described in K. Hong and W. L. Hubbell, Biochemistry 12, 4517 (1973).

The following examples are included to illustrate the practice of this invention.

PREPARATION 1

The following procedure was carried out under dim red light. Frozen, dark adapted bovine retinae were obtained and rod outer segment membrane were isolated by sucrose flotation techniques as described in K. Hong and W. L. Hubbell, Biochemistry 12, 4517 (1973). Rhodopsin was purified and isolated from the other membrane components by column chromatography on hydroxylapatite. The purified rhodopsin in 100 mM tridecyltrimethylammonium bromide in aqueous buffer was combined with purified phosphatidylcholine (PC) derived from egg yolk in a molar ratio of 1 part rhodopsin to 500 parts PC. The detergent solution was equilibrated for several hours, then the detergent removed by dialysis against an aqueous buffer solution of 100 mM sodium chloride, 3 mM potassium chloride, 1 mM ethylenediaminetetraacetic acid, and 10 mM N-2-hydroxyethylpiperazine-N'-2-ethanesulfonic acid (HEPES) pH 6.8, which had been deoxygenated with nitrogen. The dialysis medium was changed every 10 to 14 hours, for 2 to 3 days. The removal of detergent caused the phospholipids to self assemble into a bilayer membrane with the incorporated rhodopsin, known as the recombinant membrane. The recombinant membranes were collected from the dialysis bag and concentrated to a 2 percent w/v of PC by ultrafiltration with a Diaflo filter (Amicon Corporation).

A suspension of rhodopsin:egg PC (1:500) recombinants ($6.7 \times 10^{-5}$ M rhodopsin) was sonicated in an ice bath under nitrogen with a sonic probe in the presence of sufficient $CoCl_2$ to give a final $CoCl_2$ concentration of 14 mM. The optically clear suspension of recombinant vesicles was passed through a gel permeation column and eluted with an aqueous buffer, 145 mM sodium chloride in 10 mM HEPES, pH 6.8, in order to separate the recombinant vesicles and entrapped cobalt ions from the external cobalt ions. The recombinant vesicles containing cobalt were collected with a fraction collector. A sample from the most concentrated fraction (1.5 $\times 10^{-5}$ M rhodopsin) was combined with an equal volume buffer (145 mM NaCl in 10 mM HEPES) and with sufficient cobalt sensitive xylenol orange dye to give a final dye concentration of $3 \times 10^{-5}$ M. Two identical unexposed samples were examined in 1 cm cuvettes in the sample and solvent positions of a recording spectrophotometer. The difference spectrum was zero from 650 nm to 500 nm (the dye:cobalt complex absorbs at 585 nm). The sample cell was exposed to room light for 1 minute, and the difference spectra recorded again. This time a peak at 585 nm of 0.20 O.D. was observed. Visual inspection showed the exposed sample was violet, while the unexposed sample was pink (the dye form in the absence of cobalt).

PREPARATION 2

A rhodopsin:egg PC (1:500) recombinant (5.5 $\times 10^{-5}$ M in rhodopsin) was prepared as in Preparation 1 and cobalt chloride added by sonication to give a final cobalt concentration of 12 mM. The external cobalt was removed by dialysis against an aqueous buffer (145 mM NaCl and 10 mM HEPES, pH 6.8). A sample of the recombinant vesicles with entrapped cobalt ion was combined with buffer and xylenol orange dye and examined for light control of the cobalt-dye reaction as in Preparation 1. Exposure of the sample cuvette with a single flash from a Strobonar Model 782 unit, followed by a recording of the difference spectrum revealed an absorption peak at 585 nm of 0.12 O.D.

PREPARATION 3

This example is similar to Preparation 2 except that the recombinant vesicle with entrapped cobalt was mixed with aqueous buffer containing 5 percent polyacrylamide. Exposure as in Preparation 2 revealed an absorption peak at 585 nm of 0.12 O.D.

PREPARATION 4

This example is the same as Preparation 3 except that the added polymeric vehicle was 5 percent poly(N-vinyl-2-pyrrolidone). Exposure as in Preparations 2 and 3 revealed an absorption peak at 585 nm of 0.12 O.D.

EXAMPLE 1

A rhodopsin:egg PC (1:500) recombinant was prepared as in Preparation 1 and cobalt chloride added by sonication to give a final cobalt concentration of 30 mM. The external cobalt was removed by dialysis against an aqueous buffer (190 mM NaCl and 10 mM HEPES, pH 6.8). A solution of the recombinant vesicles with entrapped cobalt ions (2.9 ml) was combined with an aqueous solution of 10 percent polyacrylamide (2.0 ml), in the same buffer and $10^{-2}$ M xylenol orange dye (0.05 ml). A 10 mil coating on gel washed and subbed poly(ethylene terephthalate) support was prepared by conventional hand coating techniques at 100° F (38° C), under red light conditions. The coating was allowed to partially dry, then mounted and exposed in part with a Strobonar Model 782 flash. The unexposed areas were pink due to the uncomplexed dye, and the exposed areas were bluish-purple due to the release of cobalt and the formation of the $Co^{+++}$-dye-complex.

EXAMPLE 2

A rhodopsin:egg PC (1:500) recombinant was prepared as in Preparation 1 and cobalt chloride (30 mM) was entrapped in the recombinant vesicles as in Preparation 1. A solution of the recombinant vesicles with entrapped cobalt ions (30 mM, 2.0 ml) was combined with an aqueous buffer solution of 15 percent deionized phthalated gelatin, PA-10 (2.0 ml), and $10^{-2}$ M xylenol orange dye (0.05 ml). A 10 ml coating on gel washed and subbed poly(ethylene terephthalate) support was prepared as in Example 1, then it was chill set at 20° C. The coating was cut, mounted then exposed through a block letter with a Strobonar Model 782 flask. The unexposed areas were an orange-pink color due to the uncomplexed dye, and the exposed areas in the shape of the letter were a bluish-purple color due to the $Co^{++}$-dye-complex.

The invention has been described in detail with particular reference to preferred embodiments thereof, but it will be understood that variations and modifications can be effected within the scope of the invention.

What is claimed is:

1. A photographic element comprising a support having thereon a layer comprising a hydrophilic binder containing numerous vesicles, said vesicles comprising a matrix of lipid membranes containing rhodopsin and, within said vesicles encompassed by said membranes, a member of the group consisting of
    (a) metal cations and (b) materials selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations and located outside of the vesicles either in the same layer or in a contiguous layer, a member of the group consisting of
(a) metal cations and
(b) materials selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations wherein if the vesicles contain (a) the areas outside the vesicles contain (b) and if the vesicles contain (b) the area outside the vesicles contain a) with the proviso that (b) is not present both in the area inside the vesicles and the area outside the vesicles and that the difference in metal cation concentration inside the vesicles and outside the vesicles is at least about $10^2$.

2. The photographic element of claim 1 wherein the lipid membranes are selected from the group consisting of phospholipids, sphingolipids, glycolipids, phosphonolipids and sterols.

3. The photographic element of claim 2 wherein the lipid membranes comprise a phospholipid represented by the formula:

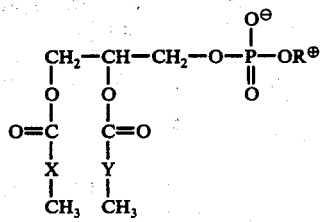

wherein X and Y are independently selected from the group consisting of saturated aliphatics and unsaturated aliphatics, and $R^{\oplus}$ is 2-trimethylammonioethyl, ammonioethyl or 2-carboxy-2-ammonioethyl.

4. The element of claim 1 wherein the molar ratio of rhodopsin to lipid in the vesicles is from 1:25 to 1:25,000.

5. The element of claim 1 wherein the metal cation is selected from the group consisting of transition metals, rare earths and alkaline earth metals.

6. The element of claim 1 wherein the metal cation is selected from groups 1B, VII and VIII of the Periodic Chart of elements.

7. The element of claim 1 wherein the metal cations are selected from the group consisting of $Co^{++}$, $Mn^{++}$, $Cu^{++}$ and $Eu_{+++}$.

8. The element of claim 1 wherein the material b) is a dye or dye precursor which changes color on complexing with metal.

9. The element of claim 1 wherein the material b) is a mixture of $CoIII(NH_3)_6$ and pyridylazoresorcinol or pyridylazonaphthol.

10. The element of claim 1 wherein the metal cation is contained in the vesicles.

11. The element of claim 1 wherein the vesicle size is from about 250 A to 10 microns.

12. The element of claim 1 containing from about $10^{15}$ vesicles/$m^2$ to $10^{19}$ vesicles/$m^2$ of support.

13. The element of claim 1 wherein the hydrophilic binder is selected from the group consisting of gelatin, poly(vinyl alcohol), polyacrylamide, and poly(N-vinyl-2-pyrrolidone).

14. A photographic element comprising a support having thereon a layer comprising a hydrophilic binder containing numerous vesicles, said vesicles containing a matrix of phospholipid membranes containing rhodopsin and, within said vesicles encompassed by said membranes, metal cations and outside the vesicles a material selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations wherein the molar ratio of rhodopsin to phospholipid is from 1:25 to 1:25,000 and the vesicle size is from about 250 A to 10 microns.

15. A photographic element comprising a support having thereon a layer comprising a hydrophilic binder containing numerous vesicles, said vesicles containing a matrix of phospholipid membranes containing rhodopsin and within said vesicles encompassed by said membranes, $Co^{++}$ ions and outside the vesicles a mixture of $CoIII(NH_3)_6$ and pyridylazoresorcinol or pyridylazonaphthol wherein the molar ratio of rhodopsin to phospholipid is from 1:25 to 1:25,000 and the vesicle size is from about 250 A to 10 microns and the phospholipid has the formula:

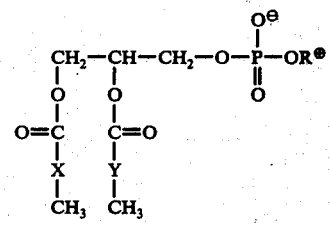

wherein X and Y are independently selected from the group consisting of saturated aliphatics and unsaturated aliphatics, and $R^{\oplus}$ is 2-trimethylammonioethyl, ammonioethyl or 2-carboxy-2-ammonioethyl.

16. A photographic composition comprising a hydrophilic binder containing numerous vesicles, said vesicles comprising a matrix of lipid membranes containing rhodopsin, and within said vesicles encompassed by said membranes, a member of the group consisting of
(a) metal cations and
(b) materials selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations and outside of the vesicles a member of the group consisting of
(a) metal cations and
(b) materials selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations wherein if the vesicles contain (a) the areas outside the vesicels contain (b) and if the vesicles contain (b) the area outside the vesicles contain (a) with the proviso that (b) is not present both in the area inside the vesicles and the area outside the vesicles and that the difference in metal cation concentration inside the vesicles and outside the vesicles is at least about $10^2$.

17. The composition of claim 16 wherein the lipid membrances are selected from the group consisting of phospholipids, sphingolipids, glycolipids, phosphonolipids and sterols.

18. The composition of claim 16 wherein the lipid membranes comprise a phospholipid represented by the formula:

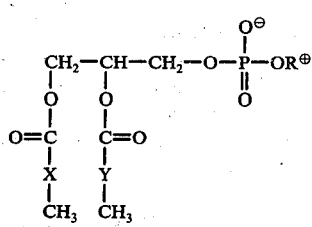

wherein X and Y are independently selected from the group consisting of saturated aliphatics and unsaturated aliphatics, and R⊕ is 2-trimethylammonioethyl, ammonioethyl or 2-carboxy-2-ammonioethyl.

19. The composition of claim 16 wherein the molar ratio of rhodopsin to lipid in the vesicles is from 1:25 to 1:25,000.

20. The composition of claim 16 wherein the metal cations are selected from the group consisting of transition metals, rare earth metals and alkaline earth metals.

21. The composition of claim 16 wherein the metal cations are selected from groups 1B, VII and VIII of the Periodic Chart of elements.

22. The composition of claim 16 wherein the metal cations are selected from the group consisting of Co++, Mn++, Cu++ and Eu+++.

23. The composition of claim 16 wherein material (b) is a dye or dye precursor which changes color on complexing with metal.

24. The composition of claim 16 wherein material (b) is a mixture of CoIII(NH$_3$)$_6$ and pyridylazoresorcinol or pyridylazonaphthol.

25. The composition of claim 16 wherein the vesicle size is from about 250 A to 10 microns.

26. The composition of claim 16 wherein the hydrophilic binder is selected from the group consisting of gelatin, poly(vinyl alcohol), poly(acrylamide) and poly(N-vinyl-2-pyrrolidone).

27. A photographic composition comprising a hydrophilic binder containing numerous vesicles, said vesicles containing a matrix of phospholipid membranes containing rhodopsin and inside the vesicles encompassed by said membranes Co++ ions and outside the vesicles a mixture of CoIII(NH$_3$)$_6$ and pyridylazoresorcinol or pyridylazonaphthol wherein the molar ratio of rhodopsin to phospholipid is from 1:25 to 1:25,000 and the vesicle size is from about 250 A to 10 microns and the phospholipid represented by the formula:

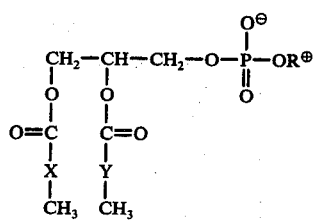

wherein X and Y are independently selected from the group consisting of saturated aliphatics and unsaturated aliphatics, and R⊕ is 2-trimethylammonioethyl, ammonioethyl or 2-carboxy-2-ammonioethyl.

28. A process of forming an image comprising imagewise exposing to light having a wave-length of 350 to 600 nm a photosensitive element comprising a support having thereon a layer comprising a hydrophilic binder containing numerous vesicles, said vesicles comprising a matrix of lipid membranes containing rhodopsin and, within said vesicles encompassed by said membranes, a member of the group consisting of
(a) metal cations and
(b) materials selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations
and located outside of the vesicles either in the same layer or in a contiguous layer, a member of the group consisting of
(a) metal cations and
(b) materials selected from the gorup consisting of chelatometric materials for said metal cations, colorimetric reagents for said metal cations, materials which are caused to react by the presence of said metal cations to form a gas or a visible reaction product, and materials which form elemental metal through redox reactions with said metal cations
wherein if the vesicles contain (a) the area outside the vesicles contain (b) and if the vesicles contain (b) the area outside the vesicles contain (a) with the proviso that (b) is not present both in the area inside the vesicles and the area outside the vesicles and that the difference in metal cation concentration inside the vesicles and outside the vesicles is at least about $10^2$ whereby the metal cations diffuse through the rhodopsin of the lipid membranes of the light activated vesicles and react with the material (b) in the exposed areas.

29. The process of claim 28 wherein the lipid membranes are selected from the group consisting of phospholipids, sphingolipids, glycolipids, phosphonolipids and sterols.

30. The method of claim 28 wherein the lipid membranes comprise a phospholipid represented by the formula:

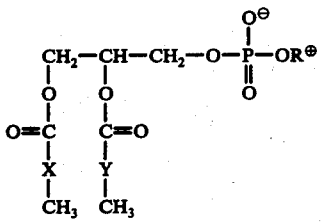

wherein X and Y are independently selected from the group consisting of saturated aliphatics and unsaturated aliphatics, and R⊕ is 2-trimethylammonioethyl, ammonioethyl or 2-carboxy-2-ammonioethyl.

31. The method of claim 28 wherein the molar ratio of rhodopsin to lipid in the vesicles is from 1:25 to 1:25,000.

32. The method of claim 28 wherein the metal cation is selected from the group consisting of transition metals, rare earths and alkaline earth metals.

33. The method of claim 28 wherein the metal cation is selected from groups 1B, VII and VIII of the Periodic Chart of elements.

34. The method of claim 28 wherein the metal cations are selected from the group consisting of $Co^{++}$, $Mn^{++}$, $Cu^{++}$ and $Eu^{+++}$.

35. The method of claim 28 wherein material (b) is a dye or dye precursor which changes color on complexing with metal.

36. The method of claim 28 wherein material (b) is a mixture of $CoIII(NH_3)_6$ and pyridylazoresorcinol or pyridylazonaphthol.

37. The method of claim 28 wherein the metal cation is contained in the vesicles.

38. The method of claim 28 wherein the vesicle size is from about 250 A to 10 microns.

39. The method of claim 28 wherein the lipid is phospholipid, the metal cations are inside the vesicles and the molar ratio of rhodopsin to phospholipid is from 1:25 to 1:25,000 and the vesicle size is from about 250 A to 10 microns.

40. A method of forming an image comprising imagewise exposing to light having a wavelength of 350 to 600 nm a photosensitive element comprising a support having thereon a layer comprising a hydrophilic binder containing a plurality of vesicles, said vesicles containing a matrix of phospholipid membranes containing rhodopsin and wherein said vesicles encompassed by said membranes, $Co^{++}$ ions and outside the vesicles a mixture of $CoIII(NH_3)_6$ and pyridylazoresorcinol or pyridylazonaphthol wherein the molar ratio of rhodopsin to phospholipid is from 1:25 to 1:25,000 and the vesicle size is from about 250 A to 10 microns and the phospholipid has the formula:

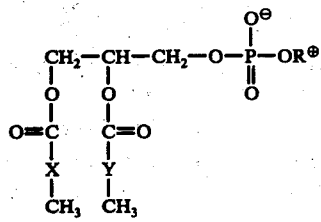

wherein X and Y are independently selected from the group consisting of saturated aliphatics and unsaturated aliphatics, and R⊕ is 2-trimethylammonioethyl, ammonioethyl or 2-carboxy-2-ammonioethyl whereby the metal cations diffuse through the rhodopsin of the phospholipid membrane of the light activated vesicles and react with the mixture of $CoIII(NH_3)_6$ and pyridylazoresorcinol or pyridylazonaphthol in the exposed areas.

41. A process for forming a stable image comprising imagewise exposing to light having a wavelength of 350 to 600 nm a photographic element comprising a support having thereon a layer comprising water and a hydrophilic binder containing numerous vesicles, said vesicles comprising a matrix of lipid membranes containing rhodopsin and, within said vesicles encompassed by said membranes, a member of the group consisting of
  (a) metal cations and
  (b) materials selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations and located outside the vesicles either in the same layer or in a contiguous layer, a member of the group consisting of
  (a) metal cations and
  (b) materials selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations
wherein if the vesicles contain (a) the area outside the vesicles contain (b) and if the vesicles contain (b) the area outside the vesicles conatin (a) with the proviso that (b) is not present both in the area inside the vesicles and the area outside the vesicles and that the difference in metal cation concentration in the vesicles and outside is at least about $10^2$ whereby the metal cations diffuse through the rhodopsin of lipid membranes of the light activated vesicles and react with the material (b) in the exposed areas wherein said photographic element after exposure is treated to reduce the water content to a level wherein the element is no longer light-sensitive.

42. A process of forming an image comprising
  (a) imagewise exposing the light having a wavelength of from 350 nm to 600 nm a photographic unit comprising
    (i) an element comprising a support having thereon a layer comprising a hydrophilic binder containing a plurality of vesicles, said vesicles comprising a matrix of lipid membranes containing rhodopsin and within said vesicles encompassed by said membranes, a metal cation and
    (ii) a removable element comprising a support and an iimage-receiving layer containing a material selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations wherein element (ii) is temporarily laminated to element (i), whereby the metal cations diffuse through the rhodopsin of the lipid membranes of the light activated vesicles and react with the materials on the image-receiving layer in the exposed areas, and (b) stripping the element (ii) from element (i) wherein the image is obtained in element (ii).

43. The process of claim 42 wherein element (i) is rendered reusable by regenerating rhodopsin into the vesicles.

44. An image transfer unit comprising
(i) an element comprising a support having thereon a layer comprising a hydrophilic binder containing a plurality of vesicles, said vesicles comprising a matrix of lipid membranes containing rhodopsin and, wherein said vesicles encompassed by said membranes, a metal cation and (ii) a removable element comprising a support and an image-receiving layer containing a material which is selected from the group consisting of chelatometric materials for said metal cations, colorimetric reagents for said metal cations, materials which are caused to react by the presence of said metal cations to form a gas or a visible reaction product, and materials which form elemental metal through redox reactions with said metal cations, wherein element (ii) is temporarily laminated to element (i) so that upon imagewise exposing the unit to light, the metal cations to element (i) diffuse through the rhodopsin of the lipid membranes of the light activated vesicles and react with the materials of the image-receiving layer in the exposed areas.

* * * * *

UNITED STATES PATENT OFFICE
CERTIFICATE OF CORRECTION

Patent No. 4,084,967            Dated April 18, 1978

Inventor(s) David Frank O'Brien

It is certified that error appears in the above-identified patent and that said Letters Patent are hereby corrected as shown below:

Column 1, line 17, "of" should read -- or --.

Column 5, line 53, the sentence beginning with "Numerous" is the start of a new paragraph;

Column 6, last line, "using" should read -- Using --.

Column 10, line 52, "flask" should read -- flash --.

Column 11, line 60, "$Eu_{+++}$" should read -- $Eu^{+++}$ --.

Column 12, lines 63-64, lines beginning with "and" and "consisting" should be flush with left margin;

Column 13, line 6, "vesicels" should read -- vesicles --.

Column 15, line 48 "wherein" should read -- within --.

Column 16, lines 23-25, lines beginning with "and", "layer" and "group" should be flush with left margin;

Column 16, line 37, "conatin" should read -- contain --.

UNITED STATES PATENT OFFICE
CERTIFICATE OF CORRECTION

Patent No. 4,084,967          Dated April 18, 1978

Inventor(s) David Frank O'Brien

It is certified that error appears in the above-identified patent and that said Letters Patent are hereby corrected as shown below:

Column 16, line 40, after "and outside" insert -- the vesicles --;

Column 17, line 15, "wherein" should read -- within --.

Signed and Sealed this

Twenty-eighth Day of November 1978

[SEAL]

Attest:

RUTH C. MASON
*Attesting Officer*

DONALD W. BANNER
*Commissioner of Patents and Trademarks*